(12) United States Patent
Yoshio et al.

(10) Patent No.: US 6,307,305 B1
(45) Date of Patent: Oct. 23, 2001

(54) PIEZOELECTRIC COMPONENT WITH LEADS

(75) Inventors: Masakazu Yoshio; Kenichi Kotani, both of Toyama-ken (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/662,104

(22) Filed: Sep. 14, 2000

(30) Foreign Application Priority Data

Sep. 17, 1999 (JP) .................................. 11-264415
Jul. 19, 2000 (JP) .................................. 12-219364

(51) Int. Cl.$^7$ .................................................. H03H 9/17
(52) U.S. Cl. ..................... 310/348; 310/366; 310/320
(58) Field of Search ..................... 310/365, 366, 310/320, 348, 353

(56) References Cited

U.S. PATENT DOCUMENTS

| | | | | |
|---|---|---|---|---|
| 5,369,382 | * | 11/1994 | Arvanitis ............................ | 310/365 |
| 5,596,244 | * | 1/1997 | Kugou et al. ........................ | 310/348 |
| 5,808,397 | * | 9/1998 | Kotani .................................. | 310/320 |
| 6,087,763 | * | 7/2000 | Kim et al. ............................ | 310/348 |
| 6,232,699 | * | 5/2001 | Wajima ................................. | 310/320 |
| 6,236,140 | * | 5/2001 | Arimura ................................. | 310/366 |

FOREIGN PATENT DOCUMENTS

| | | | | |
|---|---|---|---|---|
| 54-137995 | * | 10/1979 | (JP) ..................................... | 310/365 |
| 2-326 | | 1/1990 | (JP) ................................. | A42B/1/00 |
| 6-58620 | | 8/1994 | (JP) ................................. | H03H/9/13 |
| 6-252683 | | 9/1994 | (JP) ................................. | H03H/1/19 |

* cited by examiner

Primary Examiner—Thomas M. Dougherty
(74) Attorney, Agent, or Firm—Keating & Bennett, LLP

(57) ABSTRACT

A piezoelectric component includes leads and being arranged to suppress the adhesion of solder or a conductive adhesive agent to lead-out electrodes or vibration electrodes thereof, which is therefore resistant to the deterioration of electrical characteristics such as resonance characteristics, and which minimizes fluctuation of the electrical characteristics. In this piezoelectric component having the leads, the vibration electrodes are provided on each of the first and second main surfaces of a piezoelectric plate, and each of the vibrating electrodes is connected to a terminal electrode via a lead-out electrode. Each of the holding portions of a lead terminal is bonded to the terminal electrode, and is arranged so as not to extend onto the lead-out electrode.

20 Claims, 13 Drawing Sheets

PIEZOELECTRIC COMPONENT WITH LEADS

BACKGROUND OF THE INVENTION

1. Field of the Invention

The present invention relates to a piezoelectric component with leads used as, for example, a piezoelectric resonator or a piezoelectric filter, and more particularly, the present invention relates to a piezoelectric component with leads having an improved bonding structure between a terminal electrode and a lead terminal provided on a piezoelectric body.

2. Description of the Related Art

Various piezoelectric components including leads have been used as piezoelectric resonators and piezoelectric filters. Piezoelectric components including leads have been disclosed, for example, in Japanese Unexamined Utility Model Publication Nos. 2-326 and 6-58620, Japanese Unexamined Patent Application Publication No. 6-252683.

FIG. 17 is a perspective view showing a representative example of a conventional piezoelectric component with leads 51. The piezoelectric component with leads 51 includes a piezoelectric resonance element 52 and lead terminals 53 and 54.

As shown in FIG. 18, the piezoelectric resonance element 52 includes a piezoelectric plate 55 polarized uniformly in the thickness direction thereof. Vibration electrodes 56 and 57 are provided at the center of first and second main surfaces 55a and 55b of the piezoelectric plate 55, respectively, so as to be opposed to each other, with the piezoelectric plate 55 therebetween, on the top and bottom surfaces thereof. The vibration electrodes 56 and 57 are connected to lead-out electrodes 58 and 59, respectively. The lead-out electrodes 58 and 59 are connected to first and second terminal electrodes 60 and 61, respectively.

The terminal electrodes 60 and 61 are disposed in the vicinity of end portions of the piezoelectric plate 55. The lead terminals 53 and 54 include cup portions 53a and 54a, respectively, having a U-shaped cross section, and terminal lead-out portions 53b and 54b having a tabular shape. The inner surfaces of the cup portions 53a and 54a are bonded to the second and first terminal electrodes 61 and 60, respectively, using solder or a conductive adhesive.

To increase moisture resistance and shock resistance, the portions except the tip portions of the terminal lead-out portions 53b and 54b of the lead terminals 53 and 54 are coated with resin.

As describe above, the cup portions 53a and 54a are bonded to the terminal electrodes 61 and 60, respectively, using solder or a conductive bonding agent. Since solder or a conductive adhesive has fluidity during bonding, however, they flow along the inner surface of the cup portion 53a and 54a, and often extend to the lead-out electrodes 59 and 58, respectively. In an extreme case, the solder or conductive adhesive extends to the vibration electrodes 57 and 56, respectively. The resonance characteristics of piezoelectric component with leads 51 are, therefore, often deteriorates or experiences large fluctuation in characteristics.

SUMMARY OF THE INVENTION

To overcome the above-described problems, preferred embodiments of the present invention provide a piezoelectric component with leads, which prevents a conductive bonding agent such as solder or a conductive adhesive from flowing onto the lead-out electrode or the vibrating electrode, which is therefore resistant to the deterioration of resonance characteristics or filter characteristics, and which minimizes fluctuations in these characteristics.

A piezoelectric component with leads in accordance with preferred embodiments of the present invention includes a piezoelectric plate having first and second main surfaces, a vibrating electrode provided on each of the first and second main surfaces of the piezoelectric plate, a lead-out electrode electrically connected to each of the vibration electrodes on the first and second main surfaces of the piezoelectric plate, first and second terminal electrodes connected to the lead-out electrodes on the first and second main surfaces of the piezoelectric plate, respectively, and each of the first and second terminal electrodes disposed in the vicinity of end portions of the piezoelectric plate, and lead terminals each having lead-out portions continuous with holding portions which are disposed so as to hold the piezoelectric plate at the end portions thereof. In this piezoelectric component with leads, the holding portion of each of the lead terminals is preferably arranged so as not to extend onto the lead-out electrode, and the holding portion of each of the lead terminals is bonded to each of the terminal electrodes.

In accordance with a preferred embodiment of the present invention, where the direction in which the lead terminals extend is the height direction, the height dimension of the holding portion of the lead terminals is preferably not more than the remaining size obtained by subtracting the height dimension of the lead-out electrodes from the height dimension of the piezoelectric plate.

In another preferred embodiment of the present invention, as the above-described vibration electrodes, first and second vibration electrodes are arranged to be opposed to each other with the piezoelectric plate therebetween, whereby a piezoelectric resonator is constructed.

In a piezoelectric component with leads in accordance with preferred embodiments of the present invention, the lead terminals have a plurality of the holding portions. The holding portions have a three-dimensional shape covering at least one of the first and second main surfaces of the piezoelectric plate and an end surface thereof. Preferably, the cross section of the holding portion has a three-dimensional shape such as a substantially U-shaped configuration, a substantially V-shaped configuration, or a substantially L-shaped configuration. More preferably, the holding portion has a substantially L-shaped cross-section.

The above and other elements, characteristics, features and advantages of the present invention will be apparent from the following detailed description of preferred embodiments of the invention in conjunction with the accompanying drawings. Also, it is to be understood that the invention is not limited to the specific preferred embodiments thereof except as defined in the appended claims.

Other features, elements, characteristics and advantages of the present invention will become more apparent from the following detailed description of preferred embodiments hereof with reference to the attached drawings.

DETAILED DESCRIPTION OF PREFERRED EMBODIMENTS

Figure 1A:
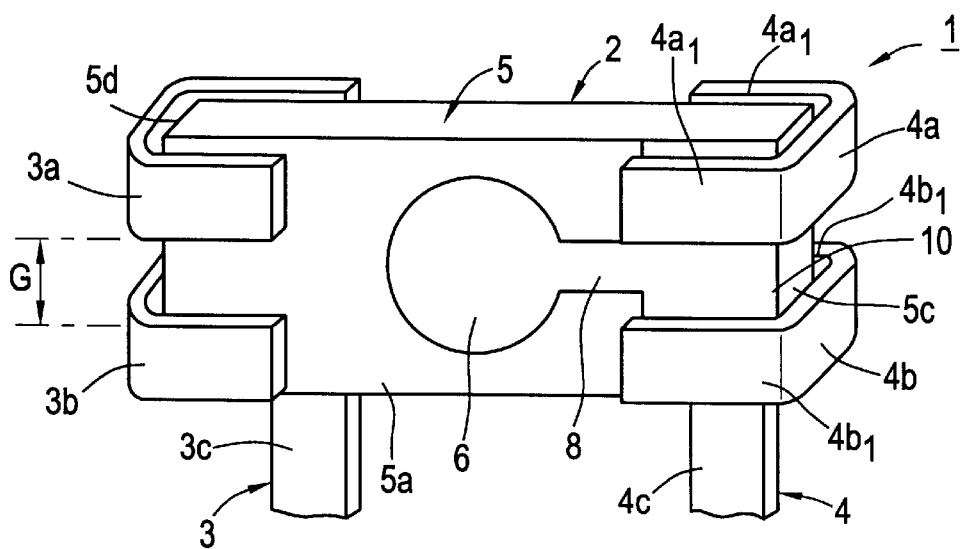
FIG. 1A is a schematic perspective view showing a piezoelectric component with leads in accordance with a first preferred embodiment of the present invention.

FIG. 1A shows a piezoelectric component with leads 1 in accordance with a first preferred embodiment of the present invention.

In this piezoelectric component with leads 1, lead terminals 3 and 4 are bonded to a piezoelectric resonance element 2.

Figure 1B:
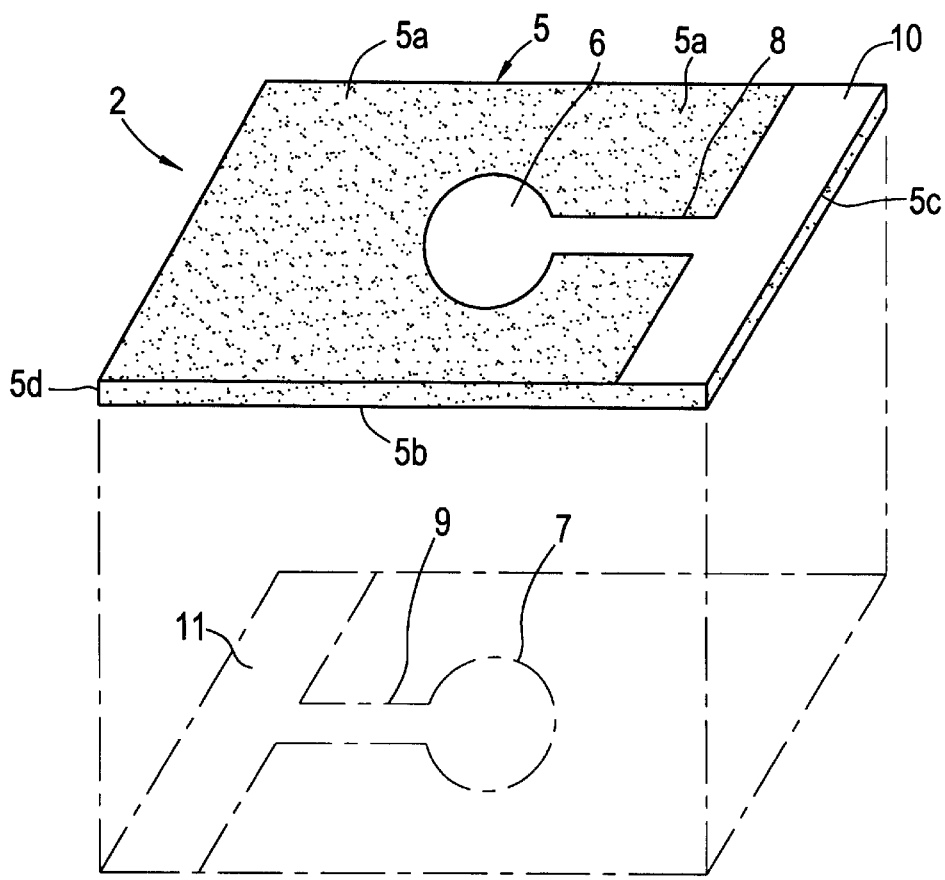
FIG. 1B is a schematic perspective view illustrating the shape of the electrodes of the piezoelectric resonance element included in preferred embodiments of the present invention.

As shown in FIG. 1B, the piezoelectric resonance element 2 includes a substantially rectangular piezoelectric plate 5. The piezoelectric plate 5 includes a piezoelectric ceramic such as lead titanate zirconate ceramic, or other suitable ceramic, and is polarized in the thickness direction. A first vibration electrode 6 is provided at the approximate central portion of one main surface 5a of the piezoelectric plate 5.

A second vibration electrode 7 is provided at the approximate central portion of the other main surface 5b of the piezoelectric plate 5, as shown by projecting downward in FIG. 1B. The vibration electrodes 6 and 7 are opposed to each other with the piezoelectric plate 5 therebetween.

A lead-out electrode 8 is electrically connected to the vibration electrode 6. Also, a lead-out electrode 9 is electrically connected to the vibration electrode 7.

The ends of the lead-out electrodes 8 and 9 are electrically connected to first and second terminal electrodes 10 and 11, respectively. The terminal electrode 10 is provided on the main surface 5a of the piezoelectric plate 5, along the edge line defined by an end face 5c and the main surface $S_a$. The terminal electrode 11 is provided on the second main surface 5b of the piezoelectric plate 5, along the edge line defined by an end surface $5_d$ opposite to the end surface 5c and the main surface 5b.

The above-described vibration electrodes 6 and 7, the lead-out electrodes 8 and 9, and the terminal electrodes 10 and 11 are made of Ag, Cu, Ag—Pd alloy, or other suitable material by a thin-film forming method such as deposition, soldering, or sputtering, or by a thick-film plating method. Alternatively, these electrodes may be made by the application and curing of a conductive paste.

The piezoelectric resonance element 2 operates as an energy-trap type piezoelectric resonator utilizing a thickness vertical vibration mode.

Figure 2:
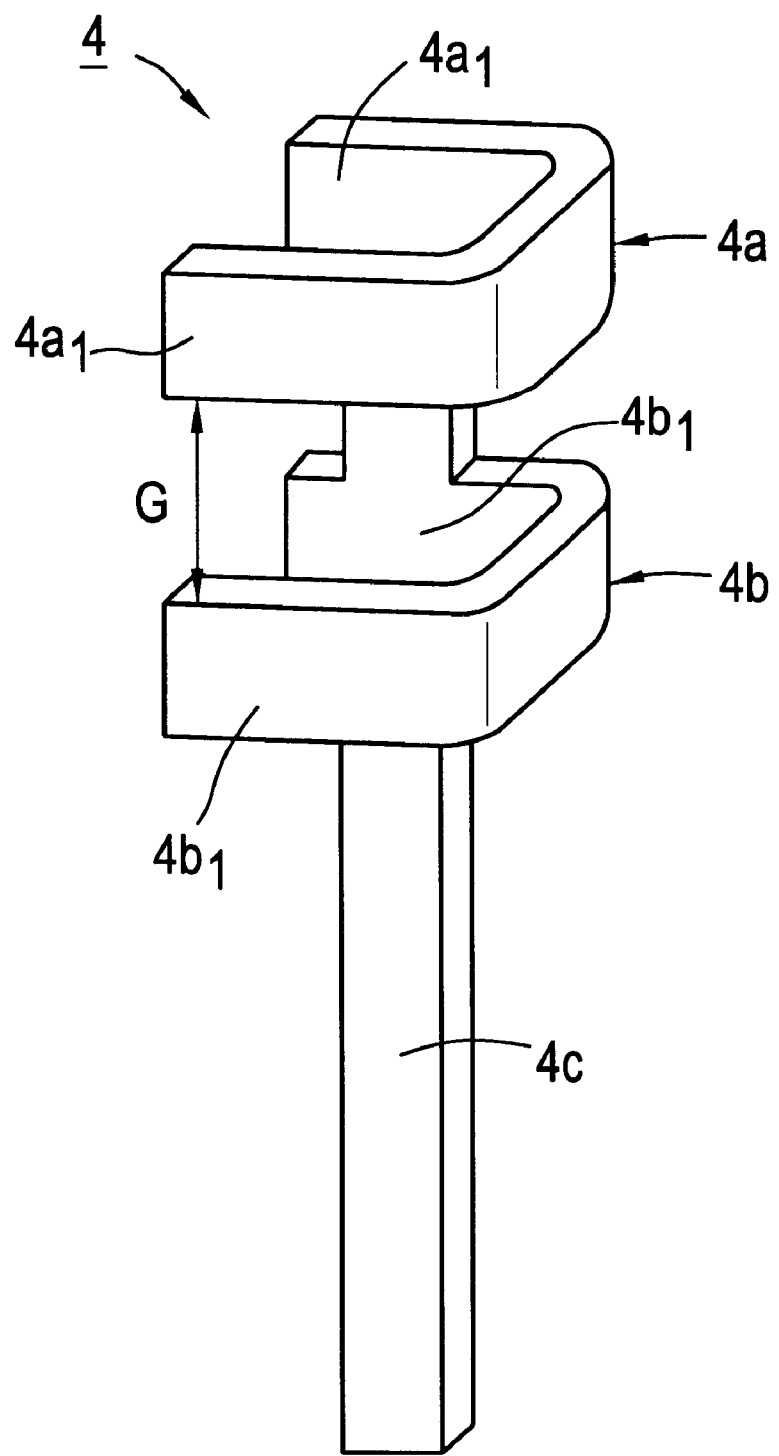
FIG. 2 is a perspective view for showing the lead terminal included in the first preferred embodiment of the present invention.

Returning to FIG. 1, the lead terminals 3 and 4 have cup portions 3a and 3b, and 4a and 4b, respectively, as holding portions, and have terminal lead-out portions 3c and 4c. The lead terminal 4 is shown in FIG. 2. Hereinafter, the direction in which the lead terminals 3 and 4 extend (the up-and-down direction of FIG. 1) is referred to as the height direction. Each of the cup portions 4a and 4b as a holding portion is provided such that the shape of the cross section thereof that is substantially perpendicular to the height-direction is substantially U-shaped. That is, the cup portions 4a and 4b each have a pair of opposed portions 4a and $4a_1$, and $4b_1$ and $4b_1$ opposed to each other, with the piezoelectric plate 5, therebetween on the main surfaces 5a and 5b thereof. The piezoelectric plate 5 is inserted into the cup portions 4a and 4b from the end surface 5c side, and the inner surfaces of the cup portions 4a and 4b are bonded to the terminal electrode 10 by soldering.

The cup portions 4a and 4b are disposed so as to be separated by a predetermined gap G. The gap G is preferably larger than the width of the lead-out electrode 8, that is, the height dimension thereof. The cup portions 4a and 4b are disposed so that the lead-out electrode 8 is not situated at the front of the cup portions 4a and 4b, that is, the lead-out electrode 8 is situated at the front of the gap G. Therefore, even though the solder moves along the inner surfaces of the cup portions 4a and 4b when bonding the terminal electrode 10 and the inner surfaces of the cup portions 4a and 4b by soldering, adhesion of the melted solder onto the lead-out electrode 8 is reliably prevented.

In particular, the length of the opposed portions $4a_1$ and $4b_1$ of the cup portions 4a and 4b is selected so that the tips of the opposed portions $4a_1$ and $4b_1$ are situated on the terminal electrode 10 side rather than the connection portion between the terminal electrode 10 and the lead-out electrode 8, thus the adhesion of melted solder onto the lead-out electrode 8 is more reliably prevented.

The other lead terminal 3 is constructed in the same manner as the lead terminal 4, and therefore connection of the cup portions 3a and 3b of the lead terminal 3 with the terminal electrode 11 by soldering reliably prevents solder from flowing onto the lead-out electrode 9, as in the case of the lead terminal 4.

In the piezoelectric component with leads 1 in accordance with this preferred embodiment, the portions except the tip portions of the lead-out portions 3c and 4c of the lead terminals 3 and 4 are also coated with a resin (not shown), as in the case of the conventional piezoelectric component with leads 51.

In the piezoelectric component with leads 1 in accordance with this preferred embodiment, since the cup portions 3a and 3b, and the cup portions 4a and 4b of the lead terminals 3 and 4 are provided so as not to extend onto the lead-out electrodes 9 and 8, respectively, the flow of solder onto the lead-out electrodes 9 and 8 as described above, and further, the adhesion of solder onto the respective vibration electrodes 7 and 6 is reliably prevented. This reliably prevents the resonance characteristics from deteriorating and reduces fluctuations in the resonance characteristics of the piezoelectric component with leads 1.

Figure 3:
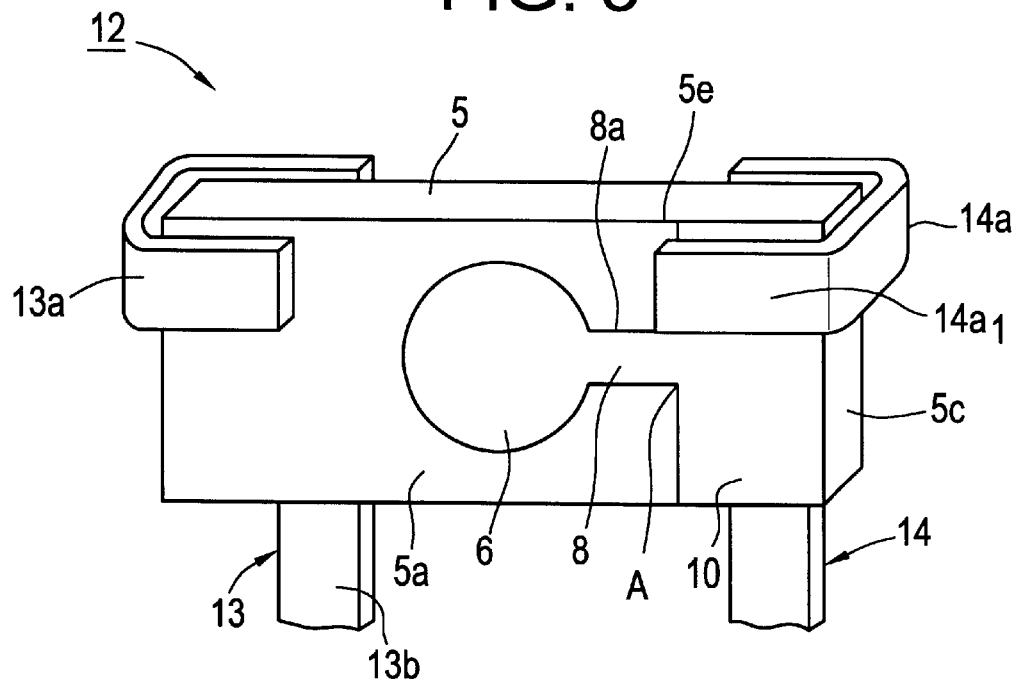
FIG. 3 is a partial perspective view showing a piezoelectric component with leads in accordance with a second preferred embodiment of the present invention.

FIG. 3 shows a piezoelectric component with leads 12 in accordance with a second preferred embodiment of the present invention. In the piezoelectric component with leads 12, lead terminals 13 and 14 have cup portions 13a and 14a with only one cup, respectively as holding portions. The cup portions 13a and 14a are constructed in the same manner as the respective cup portions 3a and 4a in the piezoelectric component with leads 1 shown in FIG. 1. That is, the cup portions 13a and 14a are arranged so as not to extend onto the lead-out electrodes 9 and 8, respectively. More particularly, for example, the height dimension of an opposed portion $14a_1$ of the cup portion 14a is preferably smaller than the distance between a side edge 8a of the lead-out electrode 8 and an edge 5e of the piezoelectric plate 5. In this preferred embodiment, the longitudinal size of the opposed portion $14a_1$ is selected so that the tip of the opposed portion $14a_1$ is situated at the end surface 5c side rather than on the connection portion between the terminal electrode 10 and the lead-out electrode 8.

In the second preferred embodiment, bonding of the opposed portion $14a_1$ to the terminal electrode 10 by soldering prevents solder from flowing onto the lead-out electrode 8, and further, from flowing towards the vibration electrode 6 side. This reliably prevents the resonance characteristics from deteriorating and reduces fluctuations in the resonance characteristics of the piezoelectric component with leads 12, as is the case with the first preferred embodiment.

Figure 4:
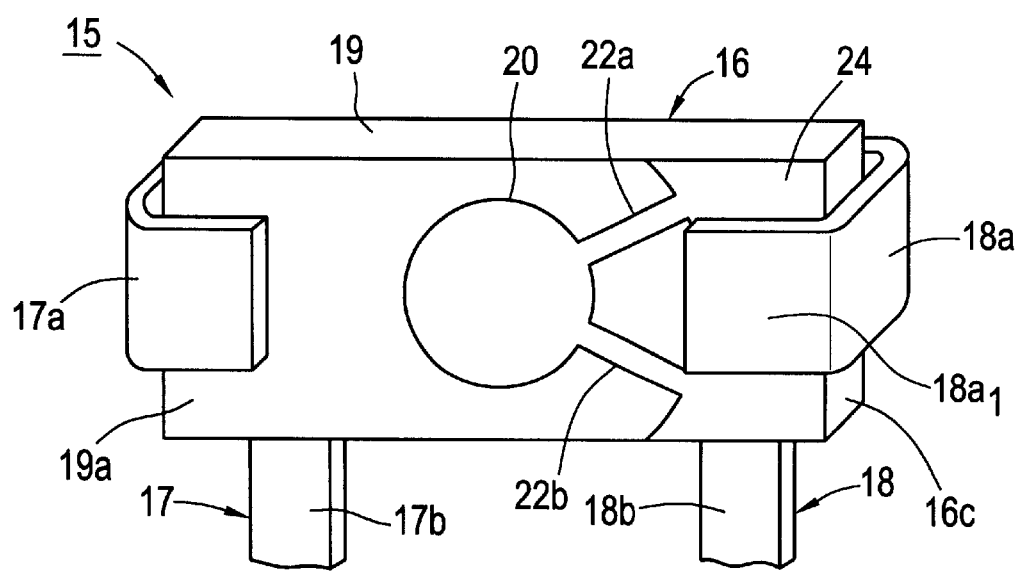
FIG. 4 is a partial perspective view showing a piezoelectric component with leads in accordance with a third preferred embodiment of the present invention.

FIG. 4 shows a piezoelectric component with leads 15 in accordance with a third preferred embodiment of the present invention. In the piezoelectric component with leads 15, lead terminals 17 and 18 are bonded to a piezoelectric resonance element 16.

Figure 5:
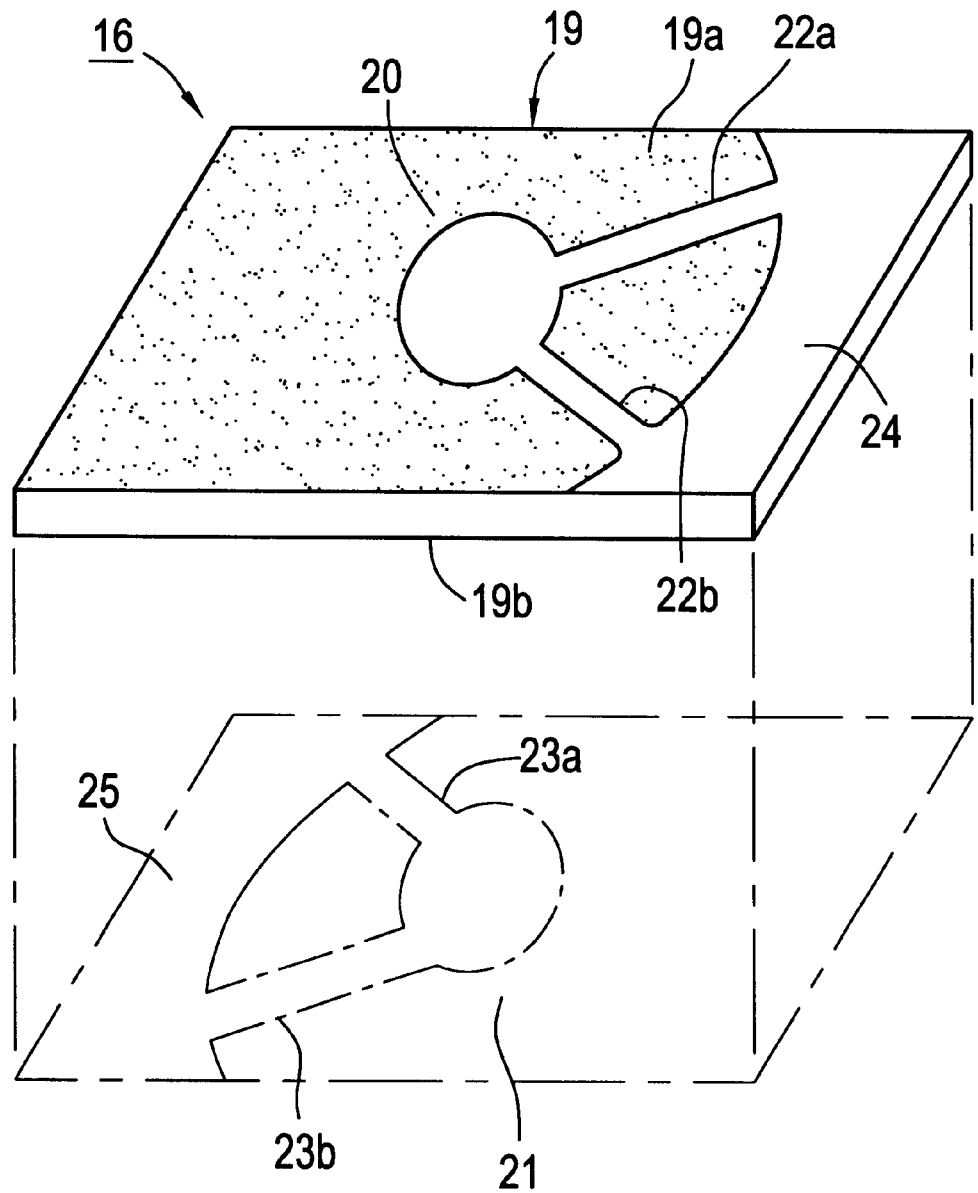
FIG. 5 is a perspective view illustrating the piezoelectric resonance element included in the third preferred embodiment.

As shown in FIG. 5, the piezoelectric resonance element 16 includes a vibration electrode 20 provided on one main surface 19a of a piezoelectric plate 19 having a substantially rectangular plate shape. As shown by projecting downward, a vibration electrode 21 is also provided at an approximately central portion of the other main surface 19b of the piezoelectric plate 19. The vibration electrodes 20 and 21 are opposed to each other with the piezoelectric plate 19 therebetween. One end of each of a pair of lead-out electrodes 22a and 22b is connected to the vibration electrode 20, and one end of each of a pair of lead-out electrodes 23a and 23b is connected to the vibration electrode 21. The other end of each of the lead-out electrodes 22a and 22b is connected to a terminal electrode 24, and the other end of each of the lead-out electrodes 23a and 23b is connected to a terminal electrode 25.

The distance between the end portions of the lead-out electrodes 22a and 22b connected to the terminal electrode 24 is larger than the distance between the end portions of the lead-out electrodes 22a and 22b connected to the vibrating electrode 20.

Returning to FIG. 4, the lead terminals 17 and 18 have cup portions 17a and 18a having a substantially U-shaped cross section as holding portions, and terminal lead-out portions 17b and 18b that are continuous with the respective cup portions 17a and 18a.

The cup portion 18a of the lead terminal 18 has an opposed portion $18a_1$ extending substantially parallel with the main surface 19a of the piezoelectric plate 19. The inner surface of the opposed portion $18a_1$ is bonded to the terminal electrode 24 preferably via soldering. Likewise, the cup portion 17a of the lead terminal 17 has an opposed portion on the side which is not shown in the figure, and the inner surface of this opposed portion is bonded to the terminal electrode 25 preferably via soldering.

In this preferred embodiment, the opposed portion $18a_1$ of the cup portion 18a is arranged so as not to extend onto the lead-out electrodes 22a and 22b. That is, the height dimension of the opposed portion $18a_1$ of the cup portion 18a is less than the distance between the end portions of the lead-out electrodes 22a and 22b connected to the terminal electrode 24. In addition, the tip of the opposed portion $18a_1$ is located at an end surface $16_c$ side rather than on the connection portions between the terminal electrode 24 and the lead-out electrodes 22a and 22b. Therefore, even though melted solder moves along the inner surface of the opposed portion $18a_1$, the solder does not extend onto the lead-out electrodes 22a and 22b.

As in the first and second preferred embodiments, in this preferred embodiment, the deterioration of the resonance characteristics due to the adhesion of solder is prevented, and fluctuations in the resonance characteristics are minimized.

In this preferred embodiment, where the direction in which a lead terminal extends is defined as the height direction, it is preferable that the depth of the holding portion of the lead terminal is not more than the remaining size obtained by subtracting the height dimension b of the lead-out electrode from the height W of the piezoelectric plate. When a plurality of cup portions are provided for one lead terminal, the total of the height dimensions of the plurality of holding portions is not more than W–b. These will be described below with reference to FIGS. 6 through 9.

Figure 6:
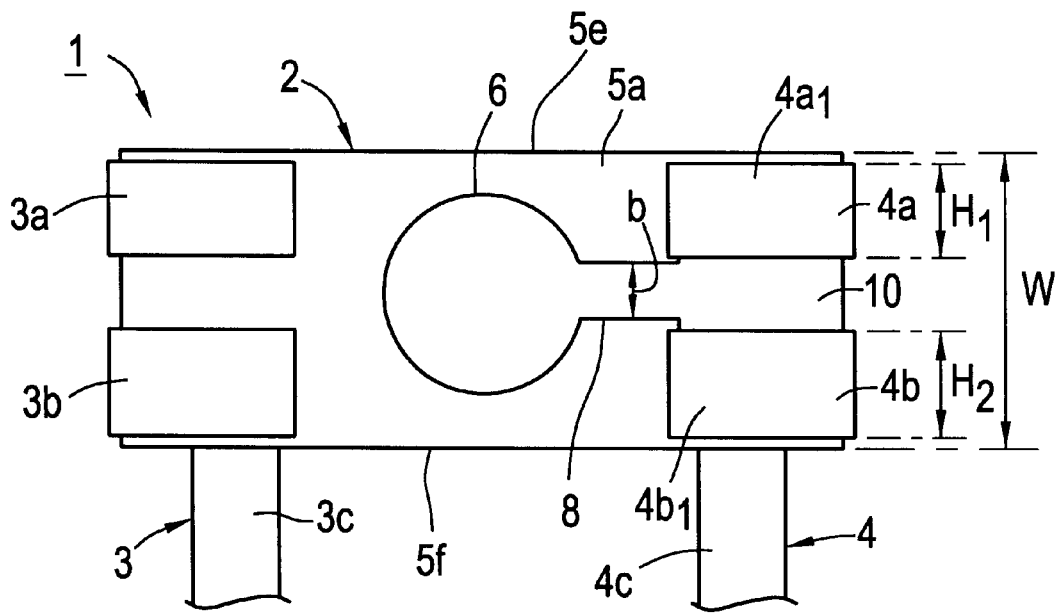
FIG. 6 is a partial front view showing preferred examples for the sizes of the holding portions of the lead terminals in the piezoelectric component with leads in accordance with the first preferred embodiment.

FIG. 6 shows the piezoelectric component with leads 1 in accordance with the first preferred embodiment of the present invention.

Regarding the height dimensions of opposed portions $4a_1$ and $4b_1$ be $H_1$ and $H_2$, respectively, the sum $H_1+H_2$ is preferably not more than the remaining size obtained by subtracting the height dimension b of the lead-out electrode 8 from the height dimension W of the piezoelectric plate 5. In this case, since the height dimension of the cup portions 4a and 4b is set as described above, the opposed portions $4a_1$ and $4b_1$ of the cup portions 4a and 4b are more reliably disposed at the areas between the lead-out electrode 8 and the edges 5e and 5f of the piezoelectric plate 5, respectively. Therefore, even though melted solder moves along the inner surfaces of the opposed portions $4a_1$ and $4b_1$, the adhesion of the melted solder onto the lead-out electrode 8 is reliably prevented.

Figure 7:
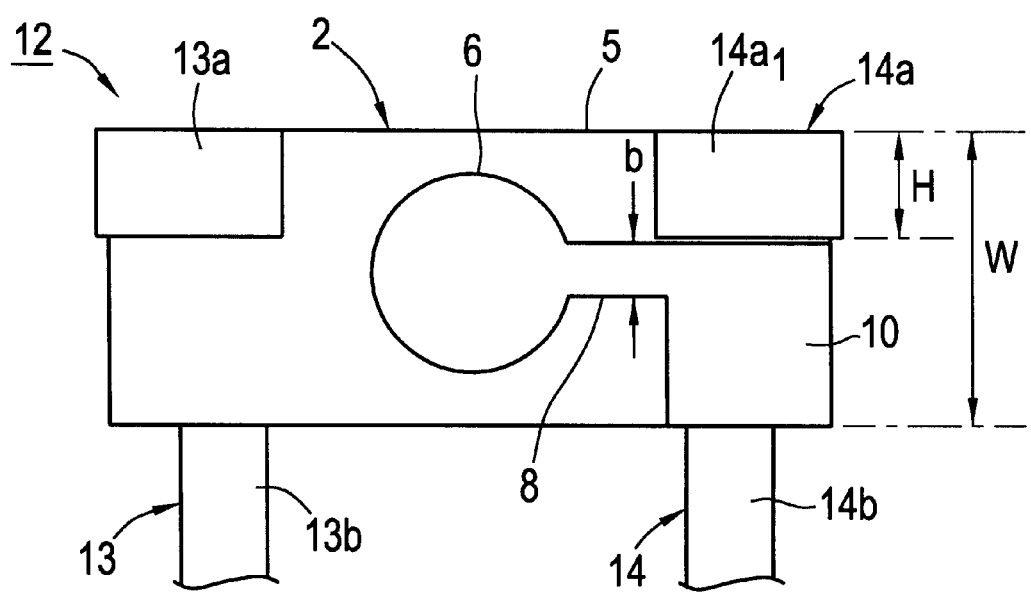
FIG. 7 is a partial front view showing preferred example for the sizes of the holding portions of the lead terminal in the piezoelectric component with leads in accordance with the second preferred embodiment.

In the piezoelectric component with leads 12 in accordance with the second preferred embodiment, FIG. 7 also shows an example in which the height dimensions H of the cup portions 13a and 14a of lead terminals 13 and 14, respectively, are not more than the remaining value obtained by subtracting the height dimension b of the lead-out electrode 8 from the height dimension W of the piezoelectric plate 5.

Figure 8:
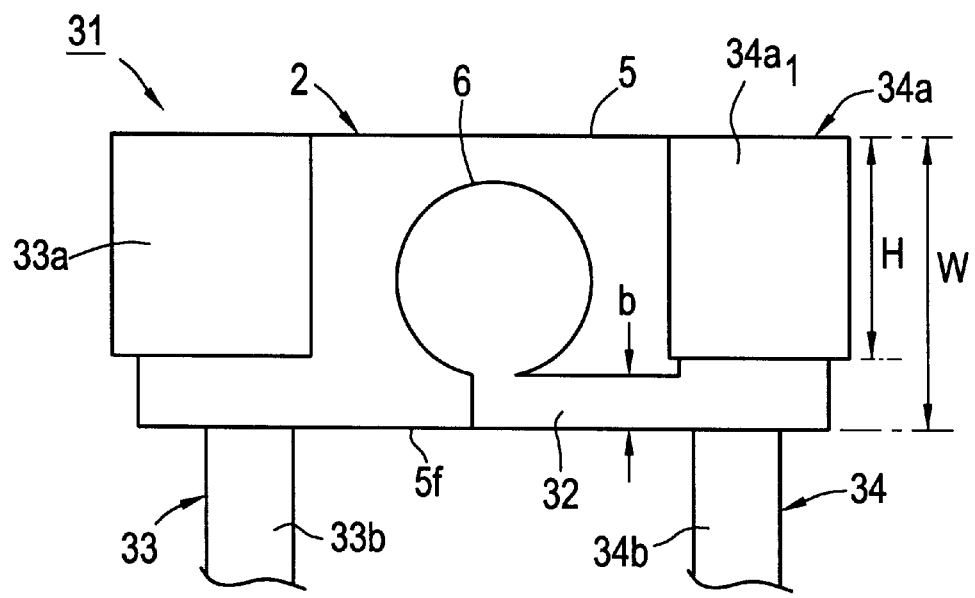
FIG. 8 is a partial front view showing the piezoelectric component with leads in accordance with a modification of the first preferred embodiment.

FIG. 8 shows a piezoelectric component with leads 31 in accordance with a variation of the present invention. In this piezoelectric component with leads 31, a lead-out electrode 32 is provided along the edge line 5f of the piezoelectric plate 5.

The lead-out electrode 32 is thus provided along the side edge of the piezoelectric plate 5. Although it is not particularly shown in the figure, the lead-out electrode provided on the other main surface of the piezoelectric plate 5 is provided along the bottom side edge shown in FIG. 8. Lead terminals 33 and 34 are bonded to the piezoelectric resonance element 2. Taking the lead terminal 34 as an example, it has one cup portion 34a and a terminal lead-out portion 34b continuous with the cup portion 34a. The height dimension of the cup portion 34a is not more than the remaining value obtained by subtracting the height dimension of the lead-out electrode 32 from the width dimension W of the piezoelectric plate 5. Therefore, even though melted solder moves along the inner surface of the opposed portion $34a_1$ of the cup portion 34, the adhesion of the solder onto the lead-out electrode 32 is reliably prevented.

Figure 9:
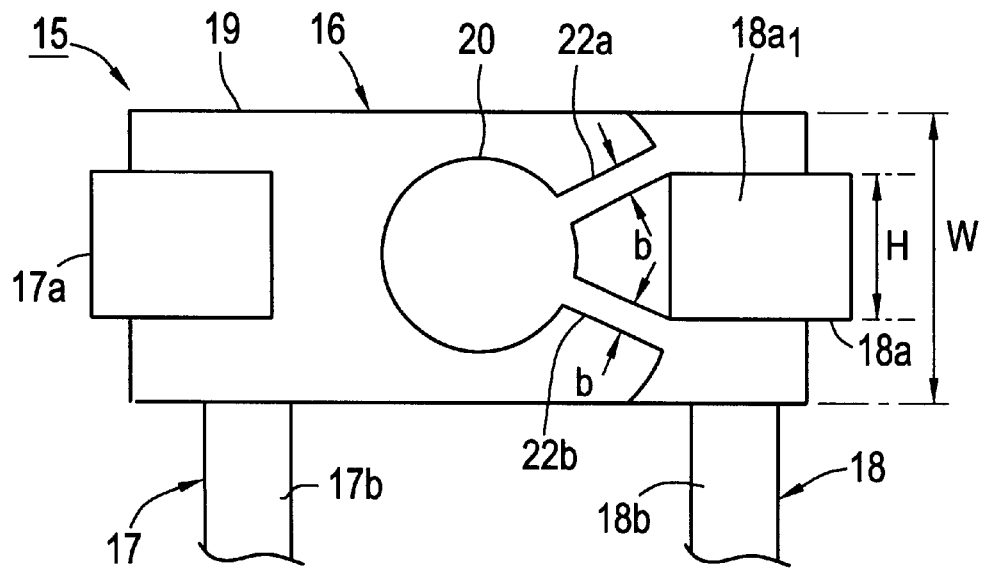
FIG. 9 is a partial front view showing a preferred example for the sizes of the holding portions of the lead terminal in the piezoelectric component with leads in accordance with the third preferred embodiment.

In the piezoelectric component with leads 15 in accordance with the third preferred embodiment, FIG. 9 shows an example in which the height dimensions of the cup portions 17a and 18a of the lead terminals 17 and 18 are set as described above.

Taking the cup portion 18a as an example, the height dimension H of the cup portion 18a is preferably not more than the remaining value obtained by subtracting the total of the height dimensions b1 and b2 of the lead-out electrodes 22a and 22b from the height dimension W of the piezoelectric plate 19. The opposed portions $18a_1$ of the cup portion 18a, therefore, are reliably and easily arranged so as not to extend onto the lead-out electrodes 22a and 22b.

Figure 10:
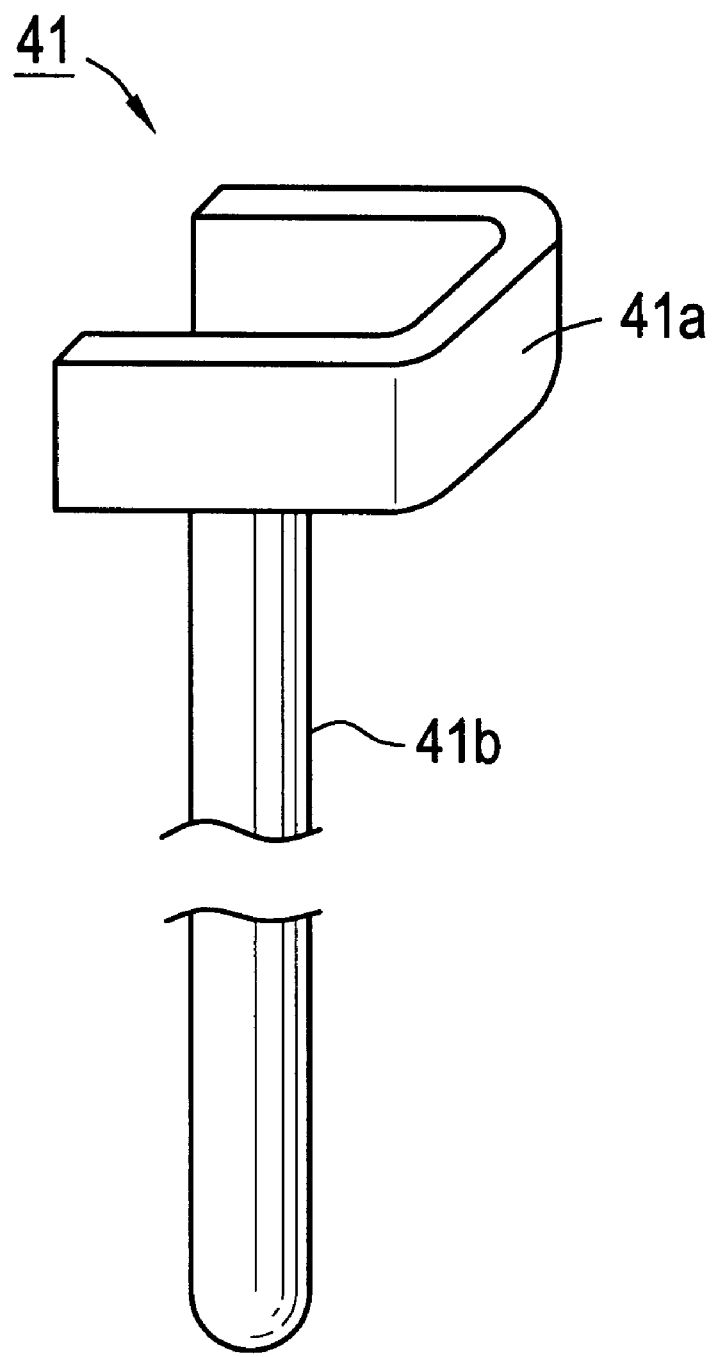
FIG. 10 is a partial perspective view showing a modification of the piezoelectric component with leads, the variation including in preferred embodiments of the present invention.

In each of the preferred embodiments as described hereinabove, for the terminal lead-out portion of the lead terminal having a cup portion as a holding portion, a terminal lead-out portion having a tabular shape has been used. However, a terminal lead-out portion 41b which is continuous with a cup portion 41a may be rod-shaped, like a lead terminal 41 shown in FIG. 10.

Regarding the lead terminal used in preferred embodiments of the present invention, the cross-sectional shape of the holding portion is not limited to a substantially U-shaped configuration. Any suitable shape such as a substantially V-shaped configuration or a substantially L-shaped configuration may be adopted as the cross-sectional shape of the holding portion. Also, in the preferred embodiments as described hereinabove, piezoelectric resonators in each of which one vibrating electrode is provided on each of both main surfaces were shown by way of examples, however, according to the present invention, a piezoelectric filter may be constructed in which a plurality of vibrating electrodes are provided on each of the first and second main surfaces of a piezoelectric plate.

Furthermore, the present invention is not limited to a piezoelectric element utilizing a thickness extensional vibration mode. Alternatively, a piezoelectric element utilizing a thickness shear mode may be used.

Figure 11:
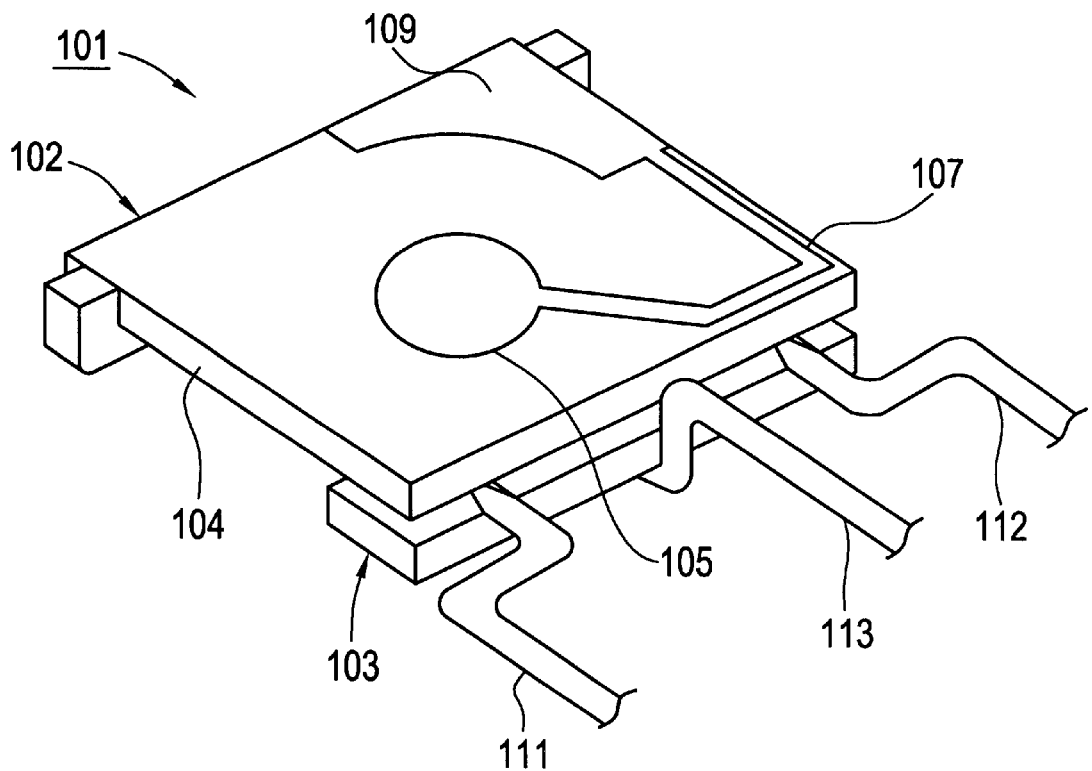
FIG. 11 is a perspective view showing a piezoelectric component with leads in accordance with a fourth preferred embodiment of the present invention.

FIG. 11 shows a piezoelectric component with leads 101 in accordance with a fourth preferred embodiment of the present invention. This piezoelectric component with leads 101 is a load-capacitor-incorporating piezoelectric oscillator having a piezoelectric resonator 102 and a capacitor 103.

The piezoelectric resonator 102 preferably includes a substantially rectangular piezoelectric substrate 104. The piezoelectric substrate 104 includes a piezoelectric ceramic such as a lead titanate zirconate ceramic, or other suitable ceramic, and is polarized in the thickness direction in this embodiment.

Figure 12A:
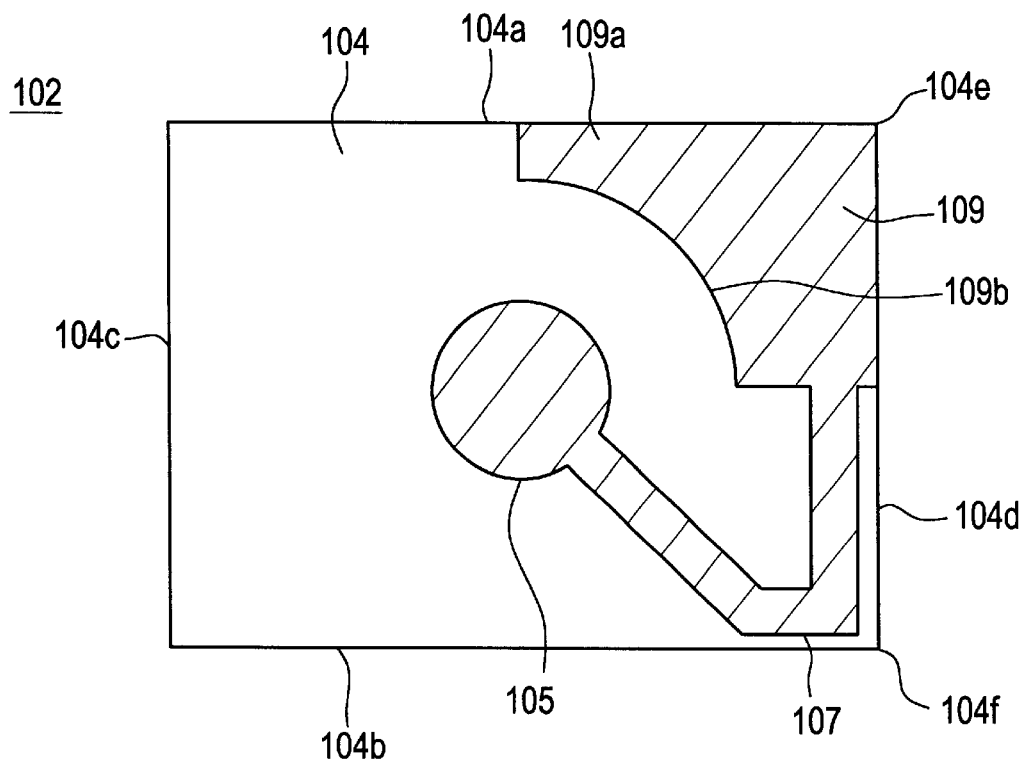
FIG. 12A is a plan view showing an energy-trap type piezoelectric resonator.
Figure 12B:
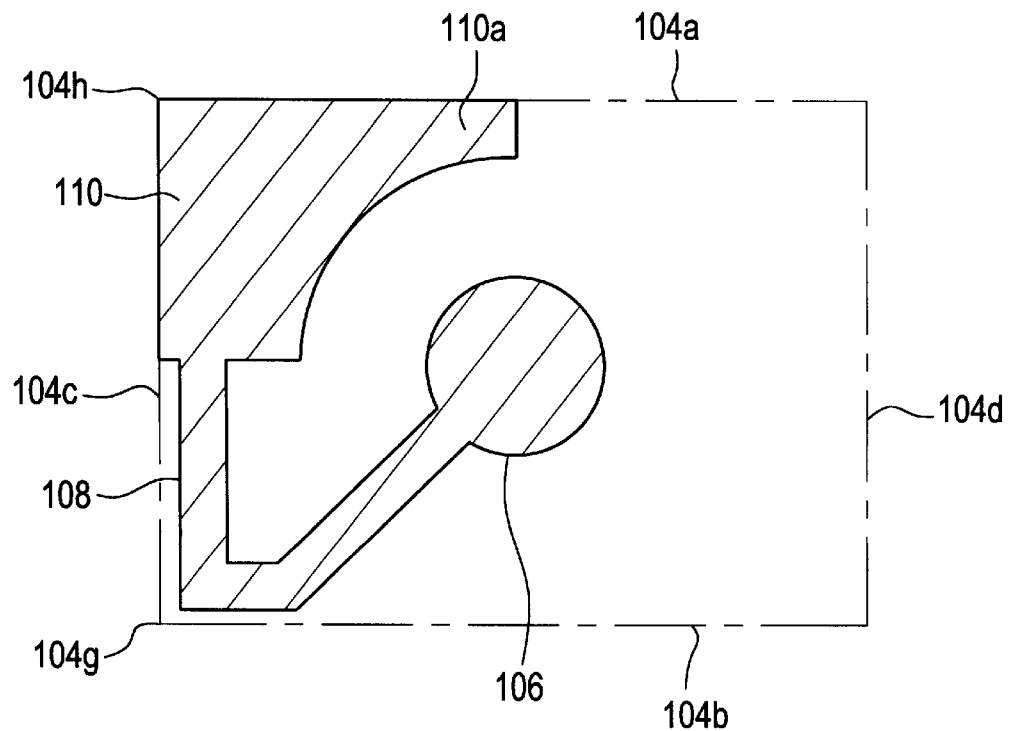
FIG. 12B is a schematic plan view showing the shapes of the electrodes on the bottom surface of a piezoelectric plate, as viewed through the piezoelectric plate.

FIGS. 12A and 12B show the shapes of the electrodes provided on the top and bottom surfaces of the piezoelectric plate 104. Here, FIG. 12B is a plan view showing the shape of the electrodes on the bottom surface, as viewed through the piezoelectric substrate 104.

As shown in FIG. 12A, a resonance electrode 105 is provided at an approximate central portion of the top surface of the piezoelectric substrate 104. A resonance electrode 106 is provided at an approximate central portion of the bottom surface of the piezoelectric substrate 104 so as to be opposed to the resonance electrode 105 with the piezoelectric substrate 104 therebetween. The portion where the resonance electrodes 105 and 106 are opposed to each other with the piezoelectric substrate 104 therebetween constitutes an energy-trap type piezoelectric vibration portion utilizing an energy-trap type thickness extensional vibration mode.

The resonance electrodes 105 and 106 are connected to terminal electrodes 109 and 110 via connection electrodes 107 and 108, respectively. A description of the shape of the connection electrode 107 will be given with reference to FIGS. 12A and 12B. The piezoelectric substrate 104 has a pair of side surfaces 104a and 104b, and a pair of end surfaces 104c and 104d intersecting the side surfaces 104a and 104b. The connection electrode 107 extends from the resonance electrode 105 toward the side edge defined by one side surface 104b and the top surface. The terminal electrode 109 is provided in the vicinity of the corner portion 104e defined by the other side surface 104a and the end face 104d. The connection electrode 107, therefore, extends from a corner portion 104f defined by the side surface 104b and the end surface 104d to the terminal electrode 109 provided in the vicinity of the above-mentioned corner portion 104e, along the edge defined by the end surface 104d and the top surface.

Likewise, the connection electrode 108, on the bottom surface of the piezoelectric substrate 104, extends from the resonance electrode 106 toward one corner portion 104g, and extends from this corner toward the opposite corner 104h along the end surface 104c. The terminal electrode 110 is provided in the vicinity of the opposite corner 104h.

Each of the terminal electrodes 109 and 110 includes a portion bonded to the holding portion of a lead terminal. The holding portion of the lead terminal described below is bonded so as not to extend to the connection electrodes 107 and 108.

The terminal electrode 109 is provided, on the top surface of the piezoelectric substrate 104, in the vicinity of the corner portion 104e along the edge defined by the side surface 104a, the end surface 104d, and the top surface.

Likewise, the terminal electrode 110 is provided along the edge defined by a side surface, an end surface, and the top surface of the piezoelectric substrate.

The terminal electrode 109 has an electrode extension portion 109a which extends farther inward than the portion where the lead terminal is bonded, in other words, a portion which extends toward the end surface 104c opposed to the end surface 104d. In this preferred embodiment, the electrode extension portion 109a extends to an approximate central portion of the side surface 104a. An inner edge 109b of the terminal electrode 109 includes the electrode extension portion 109a. The inner edge 109b opposed to the resonance electrode 105, has an arc shape.

In the present preferred embodiment, since this electrode extension portion 109a is provided, a conductive bonding agent such as solder is sufficiently held on the terminal electrode 109 when bonding the lead terminal, such that the lead terminal is reliably bonded to the terminal electrode 109. In addition, by providing solder or a conductive adhesive to extend to the electrode extension portion 109a of the terminal electrode 109, unwanted vibrations are substantially damped.

Figure 13:
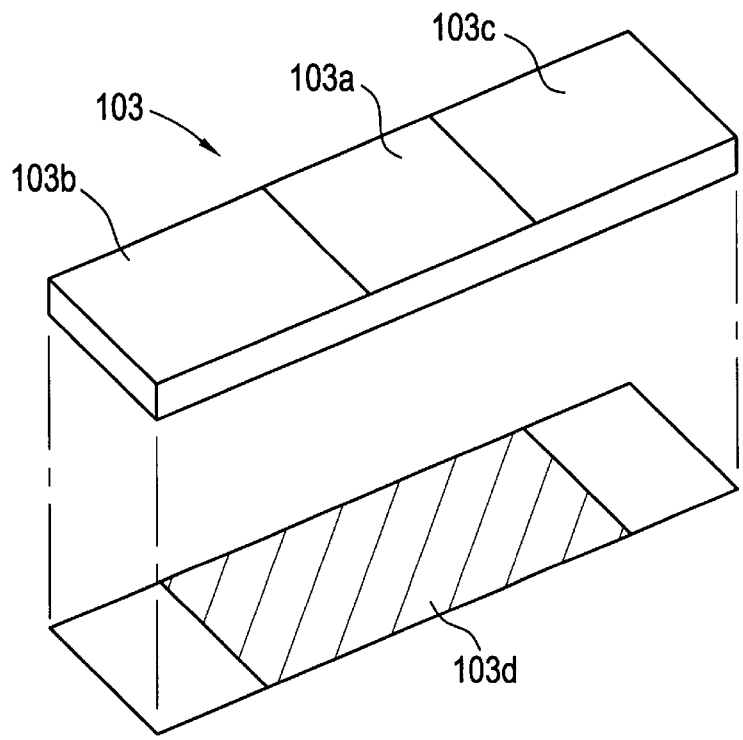
FIG. 13 is a perspective view showing a three-terminal capacitor used in the fourth preferred embodiment.

The terminal electrode 110 also has an electrode extension portion 110a similar to the terminal electrode 109. The capacitor shown in FIG. 11 is illustrated in detail in FIG. 13.

The capacitor 103 has a dielectric substrate 103a having a substantially rectangular plate shape. Capacitor electrodes 103b and 103c are disposed on the top surface of the dielectric substrate 103a, and separated by a desired gap. A capacitor electrode 103d is provided at an approximately central portion of the bottom surface of the dielectric substrate 103a, as shown by projecting downward. The capacitor electrode 103d is opposed to each of the capacitor electrodes 103b and 103c with the dielectric substrate 103a therebetween. The capacitor 103 is a three-terminal capacitor.

As shown in FIG. 11, in this preferred embodiment, lead terminals 111 through 113 are bonded to the above-described piezoelectric resonator 102 and capacitor 103. Although it is not particularly shown in FIG. 11, an exterior resin is provided to coat the portion where the lead terminals 111 to 113 are bonded to the piezoelectric resonator 102 and the capacitor 103, using a known technique.

The shapes of the lead terminals 111 to 113 will be described with reference to FIG. 14.

The lead terminal 111 has a holding portion 111a provided at the tip thereof, and a terminal lead-out portion 111b.

The cross-sectional shape of the holding portion 111a, that is, the shape of the cross section that is substantially perpendicular to the longitudinal direction of the lead terminal 111, is substantially L-shaped. Likewise, the lead terminal 112 also has a holding portion 112a and a terminal lead-out portion 112b. The piezoelectric resonator 102 is disposed between the terminal holding portions $111_a$ and 112a. The terminal holding portion $111_a$ has an opposed portion $111a_1$ which makes contact with or is opposed to the end surface 104c (see FIG. 12) of the piezoelectric plate 104, and has a placing portion $111a_2$ where the piezoelectric plate 104 is to be placed. The opposed portion $111a_1$ and the placing portion $111a_2$ extend to substantially intersect each other, and constitute the substantially L-shaped configuration described above. Likewise, in the second lead terminal 112 also, the terminal holding portion 112a has a opposed portion $112a_1$ and a placing portion $112a_2$.

Also, in the lead terminals 111 and 112, depressions 111c and 112c are provided at intermediate portions of the terminal lead-out portions 111b and 112b, respectively, in order to reduce the overall thickness of the lead terminals 111 and 112 when the capacitor 103 has been affixed thereto.

The lead terminals 111 and 112 have a substantially circular-bar shape except for the above-described holding portions $111_a$ and 112a. The above-mentioned depressions $111_c$ and 112c are constructed by press-working a substantially circular-bar-shaped wire material. The holding portions 111a and 112a can also be constructed by press-working a substantially circular-bar-shaped wire material.

The third lead terminal 113 is constructed by bending a substantially circular-bar-shaped wire material, and at the tip thereof, the third lead terminal 113 has a capacitor bonding portion 113a to be bonded to the capacitor 113. A bent portion 113b is provided between the capacitor bonding portion 113a and a terminal lead-out portion 113c.

Figure 14:
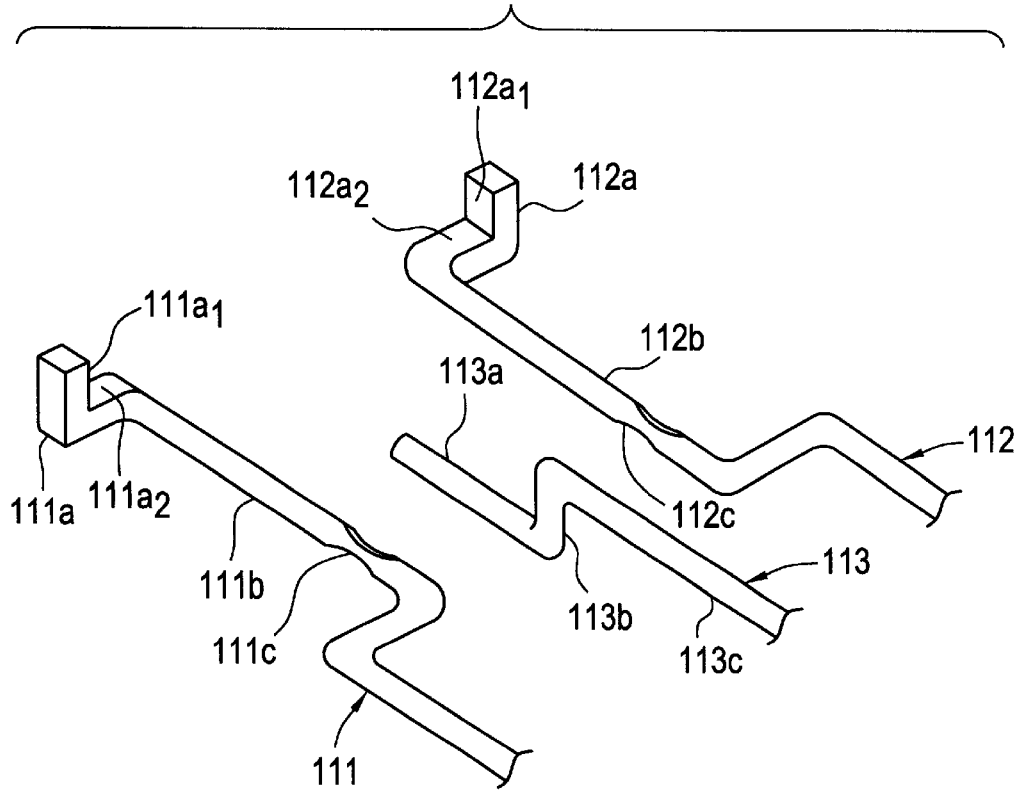
FIG. 14 is a perspective view showing first through third lead terminals used in the fourth preferred embodiment.

In bonding, the lead terminals 111 to 113 are disposed in the state shown in FIG. 14, and the piezoelectric resonator 102 and the capacitor 103 are affixed thereto. The piezoelectric resonator 102 is affixed such that the terminal electrodes 109 and 110 (see FIG. 12) of the piezoelectric resonator 102 are situated on the sides of the holding portions 112a and 111a, respectively. Since the terminal electrodes 109 and 110 have the electrode extension portion 109a and 110a, the terminal electrodes 109 and 110 are bonded to the holding portions 112a and 111a, respectively, by a sufficient amount of solder or a conductive adhesive. Preferably, the terminal electrodes 109 and 110 are provided to extend to the end surfaces 104d and 104c, respectively, and consequently the terminal electrodes 109 and 110 are bonded to the opposed portions $112a_1$ and $111a_1$ and the placing portions $112a_2$ and $111a_2$ of the holding portions 112a and 111a, respectively, using a conductive adhesive or solder.

The capacitor electrodes 103b and 103c on the top surface of the capacitor 103 are bonded to the lead terminals 111 and 112, respectively, and the capacitor electrode 103d on the bottom surface of the capacitor 103 is bonded to the third lead terminal 113, using solder or a conductive adhesive.

Because the lead terminals 111 and 112 each have depressions $111_c$ and 112c, the overall thickness thereof is reduced when the capacitor 103 has been inserted between the lead terminals 111 and 112, and the lead terminal 113.

In this preferred embodiment, the holding portions 111a and 112a of the lead terminals 111 and 112 preferably have substantially L-shaped cross sections.

Since the holding portion $111_a$ and 112a of the lead terminals 111 and 112 are bonded onto the terminal electrodes 110 and 109, respectively, and are constructed so as not to extend to the lead-out electrodes 108 and 107, respectively, the adhesion of solder onto the respective resonance electrodes 106 and 105 is reliably prevented. In particular, since the lead-out electrodes 107 and 108 pass through the portions of the corners opposed to the corners where the terminal electrodes 109 and 110 are each provided, as described above, the flow of solder onto the resonance electrodes 105 and 106 is reliably prevented.

In this preferred embodiment, where the direction in which the lead terminals 111 and 112 extend is defined as the height direction, it is preferable that the height dimensions of the holding portions $11_a$ and 112a are not more than the remaining sizes obtained by subtracting the height dimensions of the lead-out electrodes 108 and 107 from the height dimension of the piezoelectric plate 104, whereby the holding portions $111_a$ and 112a can be bonded exclusively onto the terminal electrodes with reliability.

Figure 15:
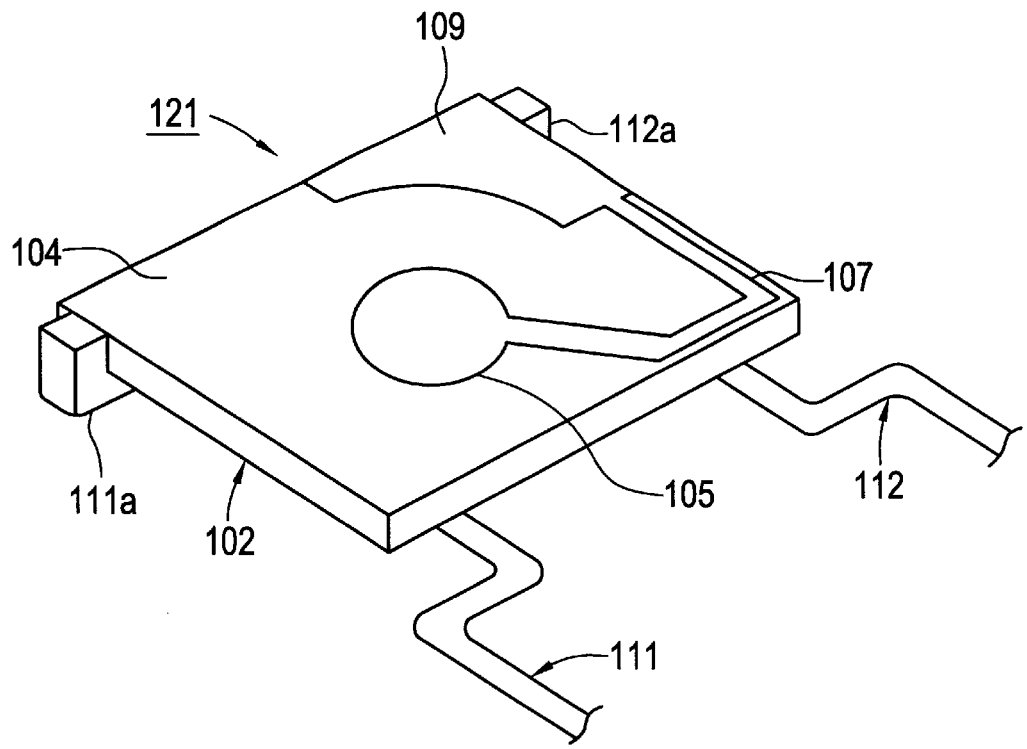
FIG. 15 is a perspective view showing the piezoelectric resonator with leads in accordance with a modification of the fourth preferred embodiment.
Figure 16:
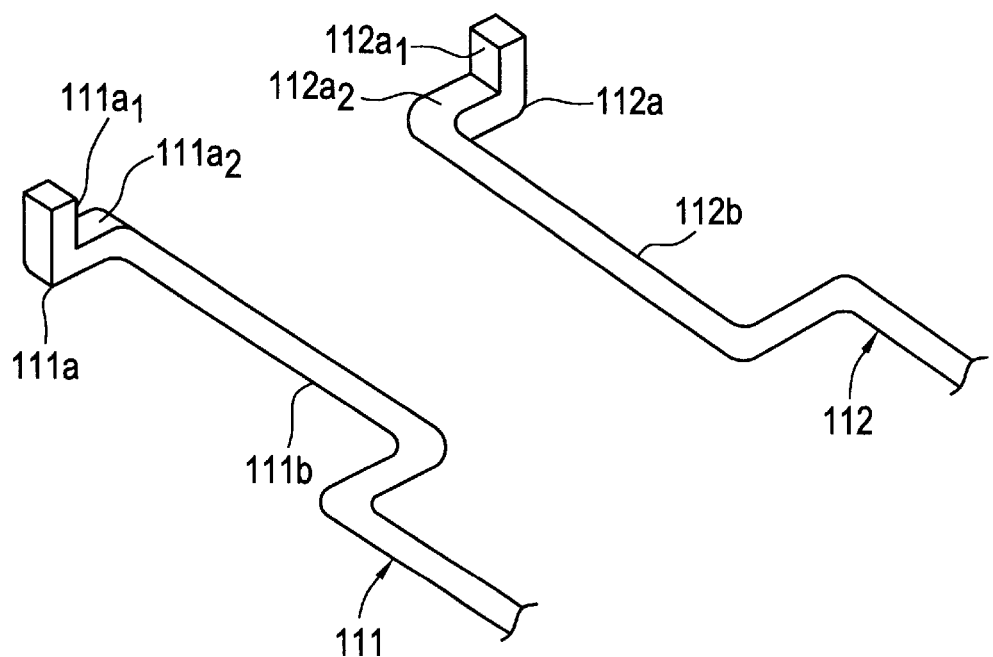
FIG. 16 is a perspective view showing a pair of lead terminals used for constructing the piezoelectric resonator shown in FIG. 15.
Figure 17:
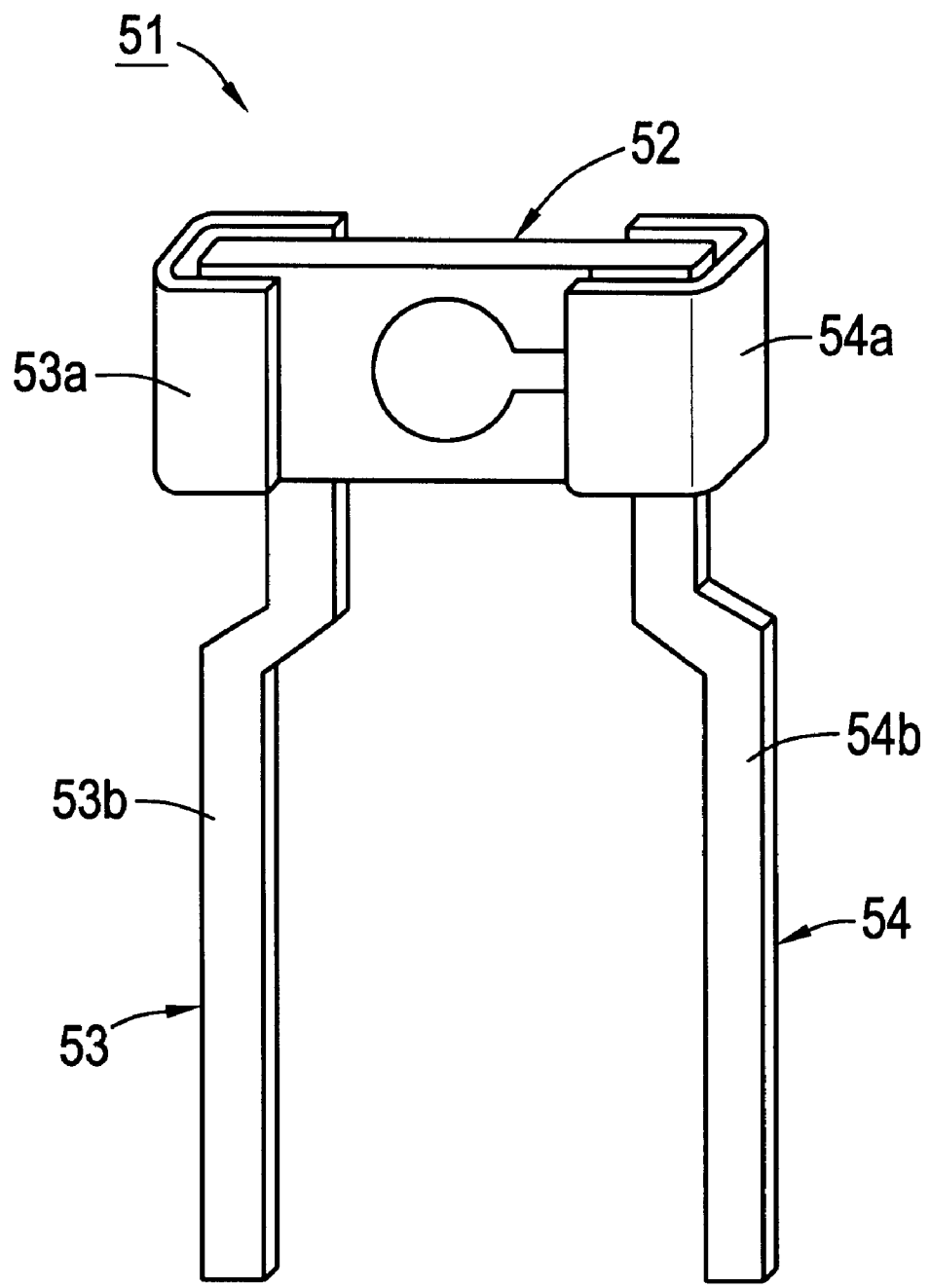
FIG. 17 is a perspective view showing a conventional piezoelectric component with leads.
Figure 18:
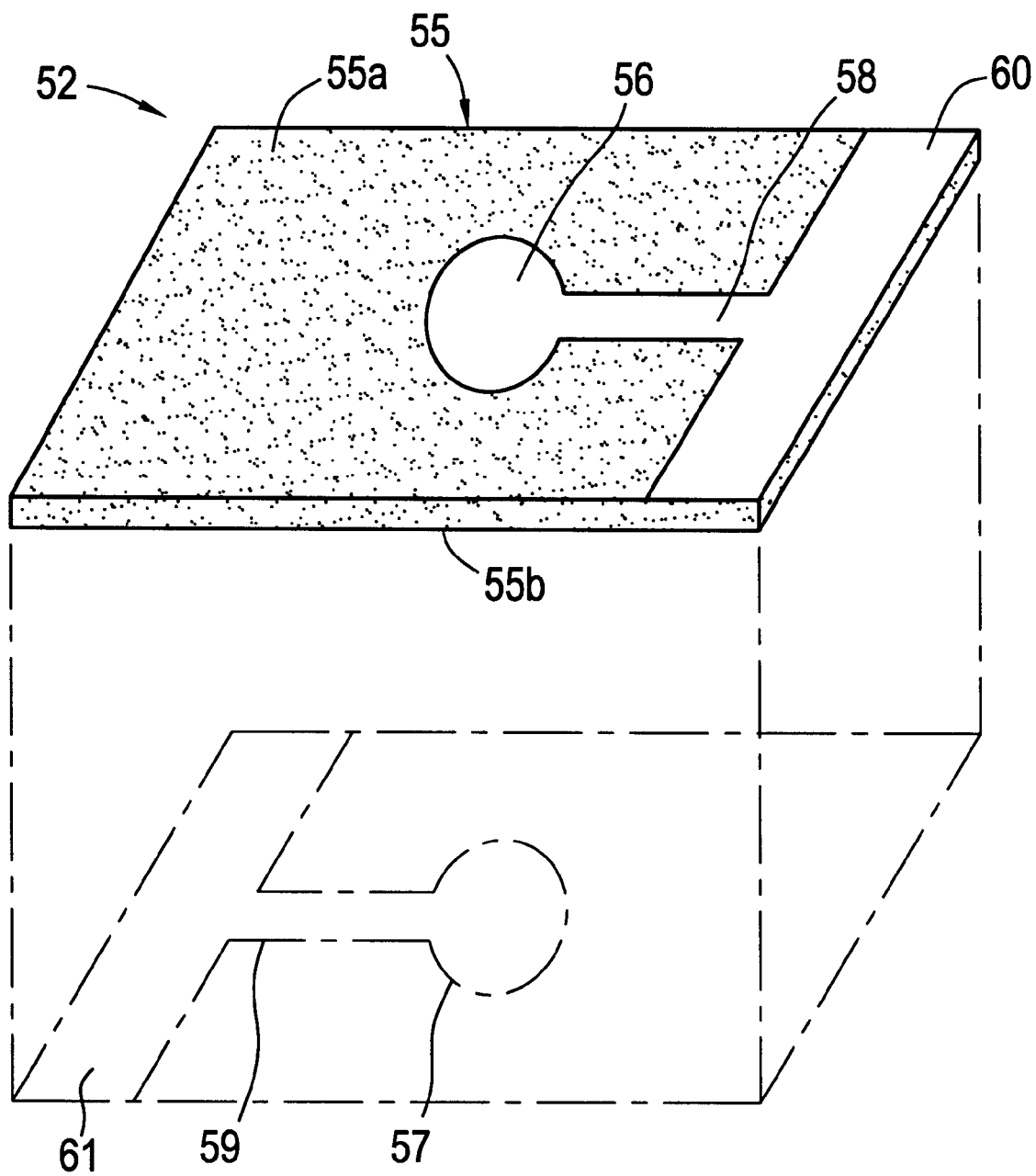
FIG. 18 is a perspective view showing a piezoelectric resonator used in a conventional piezoelectric component with leads.

In the fourth preferred embodiment, an additional capacitor-incorporating piezoelectric oscillator is constructed by combining a three-terminal capacitor 103 with the piezoelectric resonator 102. Alternatively, however, by omitting the capacitor, an energy-trap type piezoelectric oscillator 121 having a pair of lead terminals 111 and 112 is constructed as shown in FIGS. 15 and 16.

As described hereinabove, in the piezoelectric component with leads in accordance with preferred embodiments of the present invention, the holding portion of the lead terminal is disposed so as not to extend onto the lead-out electrode, and is bonded to the terminal electrode. Therefore, for example, when performing the above-described bonding using solder or a conductive adhesive having fluidity, even though the solder or conductive adhesive moves along the inner surface of the holding portion, the adhesion thereof onto the lead-out electrode is reliably prevented. Thus, the deterioration of the resonance characteristics is effectively suppressed, and fluctuations in the resonance characteristics are minimized.

Where the direction in which a lead terminal extends is defined as the height direction, when the total of the height dimension of the holding portion of the lead terminal is not more than the remaining size obtained by subtracting the height dimension of the lead-out electrode from the height dimension of the piezoelectric plate, the holding portion of the lead terminal is reliably arranged so as not to extend onto the lead-out electrode.

When, as the vibrating electrode, first and second vibrating electrodes are provided to be opposed with the piezoelectric plate therebetween, whereby a piezoelectric resonator is constructed, a piezoelectric component with leads having superior resonance characteristics with minimal fluctuation is provided.

When the lead terminal has a plurality of holding portions, since the plurality of holding portions are bonded to the terminal electrode securely and stably, a highly reliable piezoelectric component with leads is produced.

The above-described holding portion of the lead terminal may have various shapes. For example, the holding portion may have an approximately U-shaped configuration or a substantially V-shaped cup portion, or may have a holding portion having a substantially L-shaped cross section. In particular, the holding portion having a substantially L-shaped cross section can be easily obtained by press-working a substantially circular-bar-shaped wire material.

Furthermore, during assembly, where the holding portion has a substantially L-shaped cross section, a piezoelectric plate is easily disposed between the holding portions of a pair of lead terminals.

While preferred embodiments of the present invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric component with leads, comprising:
a piezoelectric plate having first and second main surfaces;
a vibration electrode provided on each of said first and second main surfaces of said piezoelectric plate;
a lead-out electrode electrically connected to each of said vibrating electrodes on said first and second main surfaces of said piezoelectric plate;
first and second terminal electrodes connected to said lead-out electrodes on said first and second surfaces of said piezoelectric plate, respectively, and each disposed in the vicinity of end portions of said piezoelectric plate; and
lead terminals each having lead-out portions that are continuous with holding portions and are arranged so as to hold said piezoelectric plate at the end portions thereof; wherein
said holding portion of each of said lead terminals is arranged so as not to extend onto the lead-out electrode; and
said holding portion of each of said lead terminals is bonded to each of said terminal electrodes.

2. A piezoelectric component with leads as claimed in claim 1, wherein where the direction in which said lead terminals extend is defined as the height direction, the height dimension of the holding portion of said lead terminals is not more than the remaining size obtained by subtracting the height dimension of said lead-out electrodes from the height dimension of said piezoelectric plate.

3. A piezoelectric component with leads as claimed in claim 1, wherein said vibration electrodes include first and second vibration electrodes arranged so as to be opposed to each other with said piezoelectric plate therebetween, such that a piezoelectric resonator is produced.

4. A piezoelectric component with leads as claimed in claim 1, wherein each of said lead terminals includes a plurality of the holding portions.

5. A piezoelectric component with leads as claimed in claim 4, wherein each of said holding portions has a three-dimensional shape covering at least one of said first and second main surfaces of said piezoelectric plate and an end surface of said piezoelectric plate.

6. A piezoelectric component with leads as claimed in claim 5, wherein each of said holding portions has a substantially L-shaped cross-section.

7. A piezoelectric component with leads as claimed in claim 5, wherein each of said holding portions has a substantially U-shaped cross section.

8. A piezoelectric component with leads as claimed in claim 5, wherein each of said holding portions has a substantially V-shaped cross section.

9. A piezoelectric component with leads as claimed in claim 4, wherein said each one of said plurality of holding members are separated from one another by a gap.

10. A piezoelectric component with leads as claimed in claim 9, wherein said gap is greater than the width of the lead-out electrode.

11. A piezoelectric component with leads as claimed in claim 1, wherein an additional lead-out electrode is electrically connected at one end portion to each of said vibrating electrodes on said first and second main surface of the piezoelectric plate and at another end portion to each of said first and second terminal electrodes.

12. A piezoelectric component with leads as claimed in claim 11, wherein a distance between end portions of said lead-out electrode and said additional lead-out electrode connected to the terminal electrode is greater than a distance between end portions of said lead-out electrode and said additional lead-out electrode connected to the vibration electrode.

13. A piezoelectric component with leads as claimed in claim 11, wherein said holding member does not extend onto the lead-out electrode or the additional lead out electrode.

14. A piezoelectric component with leads as claimed in claim 1, wherein said lead-out electrodes are provided along an edge of the piezoelectric plate.

15. A piezoelectric component with leads as claimed in claim 1, wherein said lead-out electrodes are provided in an approximately central portion of the piezoelectric plate.

16. A piezoelectric component with leads as claimed in claim 1, wherein said lead-out electrodes include a portion which extends from the vibration electrode to approximately a corner of the piezoelectric plate.

17. A piezoelectric component with leads, comprising:
- a piezoelectric plate having first and second main surfaces;
- a vibration electrode provided on each of said first and second main surfaces of said piezoelectric plate;
- a lead-out electrode electrically connected to each of said vibrating electrodes on said first and second main surfaces of said piezoelectric plate;
- first and second terminal electrodes connected to said lead-out electrodes on said first and second main surfaces of said piezoelectric plate, respectively, and each disposed in the vicinity of end portions of said piezoelectric plate; and
- lead terminals each having holding portions and lead-out portions that are continuous with each other and the holding portions are spaced from the lead out electrode and connected to the terminal electrodes.

18. A piezoelectric component with leads as claimed in claim 17, wherein said holding portions are arranged to hold said piezoelectric plate at the end portions thereof.

19. A piezoelectric component with leads as claimed in claim 17, wherein where the direction in which said lead terminals extend is defined as the height direction, the height dimension of the holding portion of said lead terminals is not more than the remaining size obtained by subtracting the height dimension of said lead-out electrodes from the height dimension of said piezoelectric plate.

20. A piezoelectric component with leads as claimed in claim 17, wherein said vibration electrodes include first and second vibration electrodes arranged so as to be opposed to each other with said piezoelectric plate therebetween, such that a piezoelectric resonator is produced.

* * * * *